(12) United States Patent
Tsai et al.

(10) Patent No.: US 11,776,884 B2
(45) Date of Patent: Oct. 3, 2023

(54) POROUS BODY ON THE SIDE SURFACE OF A CONNECTOR MOUNTED TO SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yuning Tsai, Yokohama Kanagawa (JP); Hidetoshi Kuraya, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 166 days.

(21) Appl. No.: 17/468,595

(22) Filed: Sep. 7, 2021

(65) Prior Publication Data
US 2022/0077029 A1    Mar. 10, 2022

(30) Foreign Application Priority Data

Sep. 8, 2020    (JP) .................................. 2020-150569

(51) Int. Cl.
*H01L 23/522*    (2006.01)
*H01L 21/768*    (2006.01)
*H01L 23/495*    (2006.01)
*H01L 23/31*    (2006.01)
*H01L 23/00*    (2006.01)

(52) U.S. Cl.
CPC .. *H01L 23/49517* (2013.01); *H01L 23/49582* (2013.01); *H01L 23/3121* (2013.01); *H01L 23/49513* (2013.01); *H01L 24/33* (2013.01); *H01L 24/40* (2013.01); *H01L 2224/33181* (2013.01); *H01L 2224/40175* (2013.01)

(58) Field of Classification Search
CPC ... H01L 2924/181; H01L 24/32; H01L 24/33; H01L 24/37; H01L 23/49517; H01L 23/49582
See application file for complete search history.

(56) References Cited

U.S. PATENT DOCUMENTS

| | | | |
|---|---|---|---|
| 2005/0006778 A1* | 1/2005 | Shinyama | H01L 24/29 257/E23.092 |
| 2009/0096100 A1* | 4/2009 | Kajiwara | H01L 24/33 252/512 |
| 2015/0214138 A1 | 7/2015 | Takagi et al. | |

(Continued)

FOREIGN PATENT DOCUMENTS

| | | |
|---|---|---|
| JP | 2015-142077 A | 8/2015 |
| JP | 5807340 B2 | 11/2015 |

(Continued)

*Primary Examiner* — Alonzo Chambliss
(74) *Attorney, Agent, or Firm* — Kim & Stewart LLP

(57) ABSTRACT

A semiconductor device according to an embodiment includes a base frame, a semiconductor element provided on the base frame, a connector provided on the semiconductor element, the connector having an upper surface, a side surface, and a porous body having a plurality of pores provided on at least the side surface, and a molded resin provided in a periphery of the semiconductor element and at least the side surface of the connector. The upper surface of the connector is exposed.

10 Claims, 2 Drawing Sheets

(56) References Cited

U.S. PATENT DOCUMENTS

2017/0047302 A1    2/2017  Morita et al.
2019/0139866 A1    5/2019  Kuraya et al.
2020/0411400 A1*  12/2020  Riedl .................... H01L 21/56

FOREIGN PATENT DOCUMENTS

| JP | 2017-038026 A | 2/2017 |
| JP | 2017-071165 A | 4/2017 |
| JP | 6440794 B1 | 12/2018 |
| JP | 2019-087657 A | 6/2019 |
| JP | 2019-087757 A | 6/2019 |

* cited by examiner

POROUS BODY ON THE SIDE SURFACE OF A CONNECTOR MOUNTED TO SEMICONDUCTOR DEVICE

CROSS-REFERENCE TO RELATED APPLICATION

This application is based upon and claims the benefit of priority from Japanese Patent Application No. 2020-150569, filed on Sep. 8, 2020, the entire contents of which are incorporated herein by reference.

FIELD

Embodiments described herein relate generally to a semiconductor device.

BACKGROUND

Power semiconductor elements designed for power control, such as metal-oxide-semiconductor field-effect transistors (MOSFETs) and insulated gate bipolar transistors (IGBTs), have been developed for a wide range of fields such as power generation and power transmission, rotating machines such as pumps and blowers, power supply devices such as communication systems and factories, railways using AC motors, electric vehicles, and home electric appliances.

A semiconductor device as a power module using such a power semiconductor element has been developed. Such a semiconductor device needs to have specifications such as high current density, low loss, and high heat dissipation.

DETAILED DESCRIPTION

Figure 1:
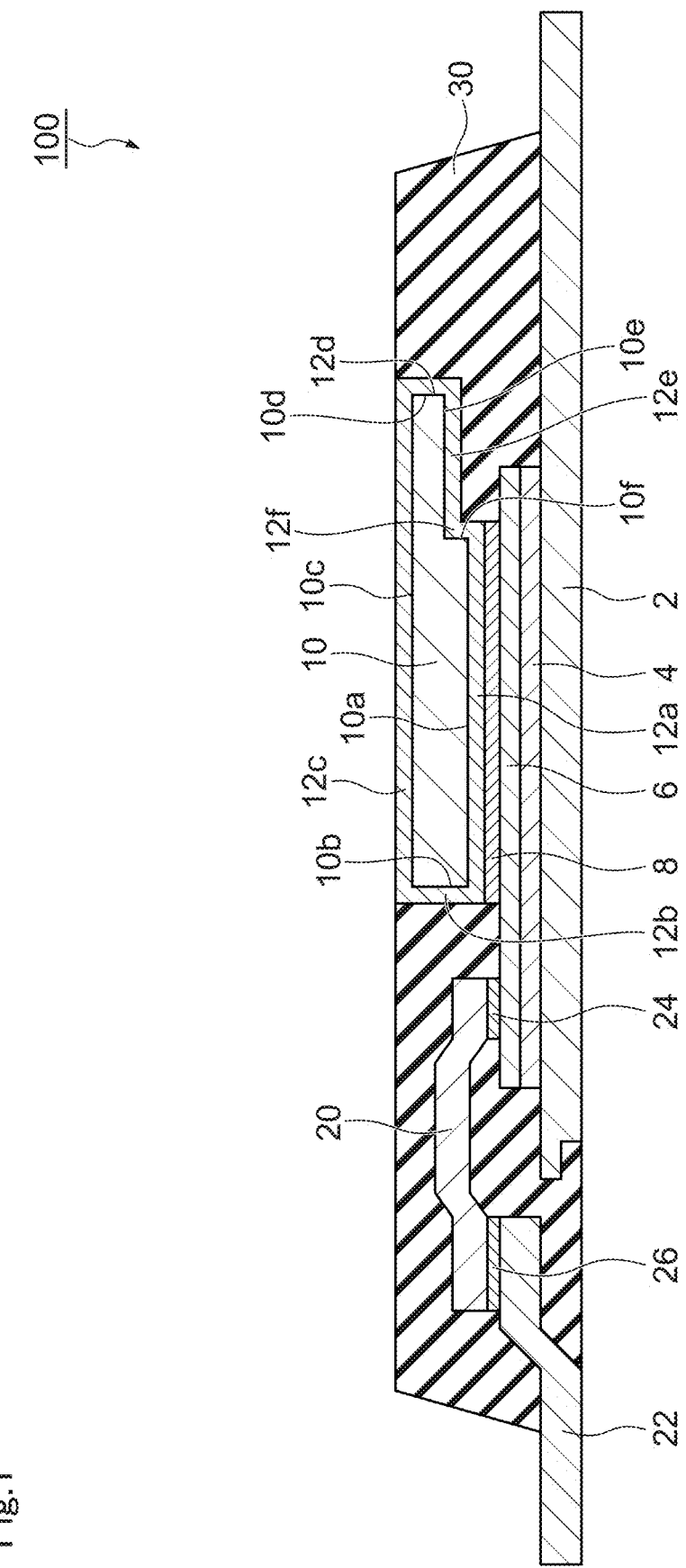
FIG. 1 is a schematic cross-sectional view of a semiconductor device according to an embodiment.

Hereinafter, an embodiment of the present disclosure will be described with reference to the drawings. In the following description, the same or similar members may be denoted by the same reference numerals. The description of members and the like described once may be appropriately omitted.

In the present specification, in order to show a locational relationship between components and the like, an upward direction of the drawing is described as "upper" and a downward direction of the drawing is described as "lower". In the present specification, the terms "upper" and "lower" are not necessarily terms indicating a relationship with a direction of gravity.

EMBODIMENT

A semiconductor device according to an embodiment includes a base frame, a semiconductor element provided on the base frame, a connector provided on the semiconductor element, the connector having an upper surface, a side surface, and a porous body having a plurality of pores provided on at least the side surface, and a molded resin provided in a periphery of the semiconductor element and at least the side surface of the connector. The upper surface of the connector is exposed.

FIG. 1 is a schematic cross-sectional view of a semiconductor device 100 according to the present embodiment.

The semiconductor device 100 includes a base frame 2, a first bonding material 4, a semiconductor element 6, a second bonding material 8, a source connector (an example of a connector) 10, a gate connector 20, a connector 22, a third bonding material 24, a fourth bonding material 26, and a molded resin 30.

The base frame 2 is used for connection between the semiconductor element 6 and an external electric circuit (not illustrated). The base frame 2 is, for example, an electrically conductive plate-like member.

The semiconductor element 6 is provided on the base frame 2. The semiconductor element 6 is, for example, a vertical MOSFET, but is not limited thereto. For example, when the semiconductor element 6 is the MOSFET, a drain electrode (not illustrated) provided on a bottom surface of the semiconductor element 6 is electrically connected to the base frame 2 by the first bonding material 4 provided between the semiconductor element 6 and the base frame 2.

The source connector 10 is provided on the semiconductor element 6. The source connector 10 includes a bottom surface 10a, a side surface 10b, an upper surface 10c, a side surface 10d, a surface 10e, and a side surface 10f. For example, when semiconductor element 6 is the MOSFET, a source electrode (not illustrated) provided on an upper surface of the semiconductor element 6 is electrically connected to the source connector 10 by the second bonding material 8 provided between the semiconductor element 6 and the source connector 10. The source connector 10 is used, for example, for electrical connection between the source electrode of the semiconductor element 6 and an external electric circuit (not illustrated).

The source connector 10 includes a porous body 12. Specifically, the porous body 12 having a plurality of pores is provided at least on the side surface 10b of the source connector 10. In the semiconductor device 100, porous bodies 12a, 12b, 12c, 12d, 12e, and 12f as the porous body 12 are provided on the bottom surface 10a, the side surface 10b, the upper surface 10c, the side surface 10d, the surface 10e, and the side surface 10f of the source connector, respectively. The porous bodies 12a, 12c, 12d, 12e, and 12f may not be provided.

One end of the gate connector 20 is electrically connected to a gate electrode (not illustrated) provided on the upper surface of the semiconductor element 6 by the third bonding material 24. The other end of the gate connector 20 is electrically connected to the connector 22 via the fourth bonding material 26. The gate connector 20 and the connector 22 are used for electrical connection between the gate electrode of the semiconductor element 6 and an external electric circuit (not illustrated). A wire such as a bonding wire may be used for the electrical connection between the gate electrode of the semiconductor element 6 and the external electric circuit.

The molded resin 30 is provided on an upper surface of the base frame 2, a periphery of the first bonding material 4, a periphery of the semiconductor element 6, a periphery of the gate connector 20, a periphery of the third bonding material 24, and a periphery of the fourth bonding material 26. The molded resin 30 is provided on surfaces of the porous bodies 12a, 12b, 12d, 12e, and 12f. The porous body 12c, a bottom surface of the base frame 2, and a part of the connector 22 are exposed. In the case of the source connector 10 in which the porous body 12c is not provided, the upper surface 10c of the source connector 10 is exposed.

The base frame 2, the source connector 10, the gate connector 20, and the connector 22 contain, for example, metal such as copper (Cu) or an alloy. A thin film containing, for example, gold (Au), platinum (Pt), palladium (Pd), silver (Ag), copper (Cu), tin (Sn), nickel (Ni), or the like may be provided on surfaces of the base frame 2, the source connector 10, the gate connector 20, and the connector 22.

A conductive resin containing solder or silver fine particles is used as the first bonding material 4, the second bonding material 8, the third bonding material 24, and the fourth bonding material 26.

The porous body 12 contains, for example, aluminum (Al), zinc (Zn), magnesium (Mg), nickel (Ni), cobalt (Co), iron (Fe), chromium (Cr), titanium (Ti), zirconium (Zr), and copper (Cu). The porous body 12 may be an alloy containing the above elements. The porous body 12 preferably contains Ni.

The molded resin 30 is, for example, an epoxy resin containing a filler such as silica ($SiO_2$) particles.

Figure 2:
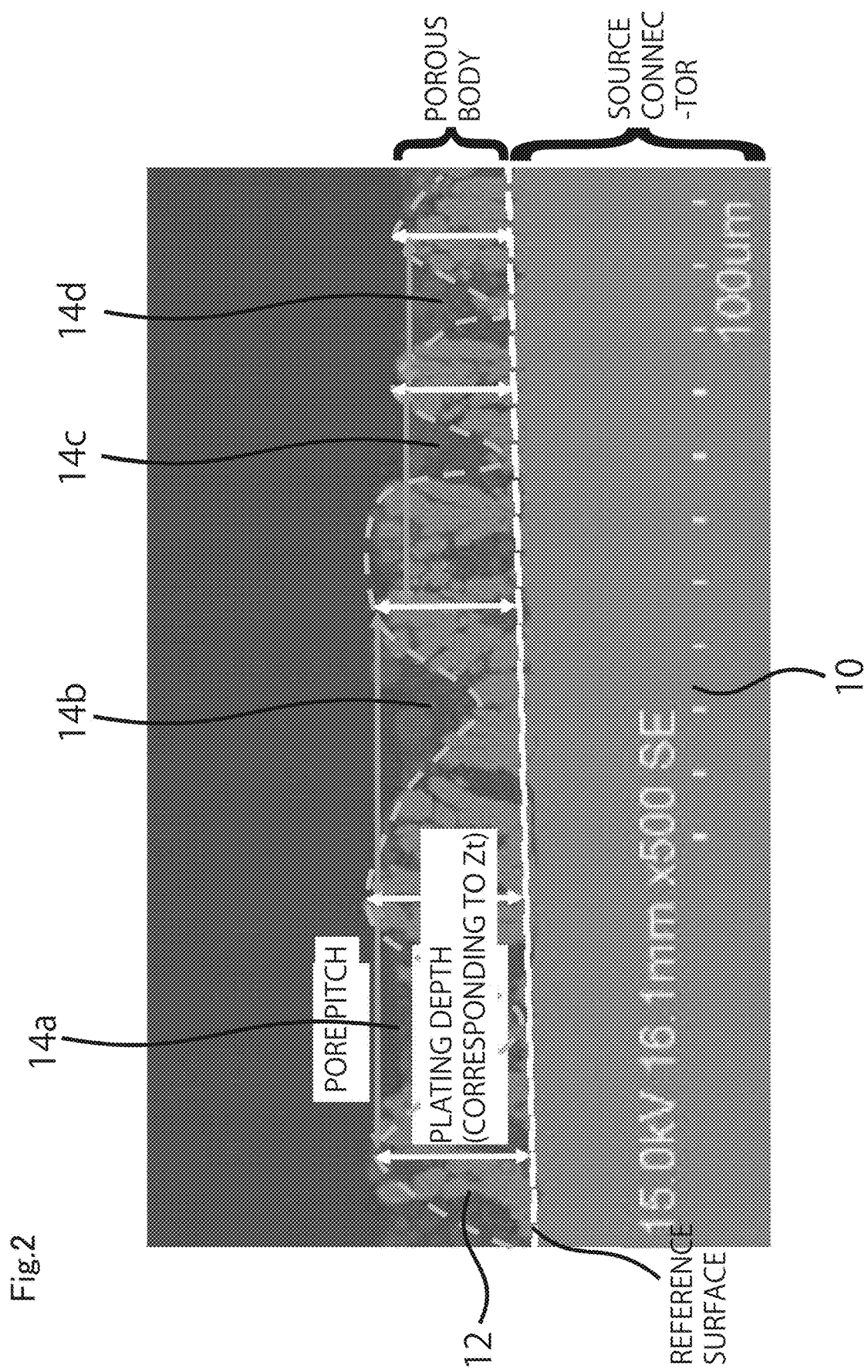
FIG. 2 is a microscope photograph of a cross section of a porous body and a source connector according to the embodiment.

FIG. 2 is a microscope (scanning electron microscope (SEM)) photograph of a cross section of the porous body 12 and the source connector 10 according to the embodiment. The microscope photograph illustrated in FIG. 2 is captured at a magnification of 500 times. The porous body 12 is formed on the source connector 10. The porous body 12 has a plurality of pores 14. FIG. 2 illustrates pores 14a, 14b, 14c, and 14d as the plurality of pores 14. The porous body 12 illustrated in FIG. 2 is made of Ni.

An average plating depth (an example of an average depth) of the plurality of pores 14 is preferably equal to or more than 3 μm and equal to or less than 20 μm.

An average pore pitch of the plurality of pores 14 is preferably equal to or more than 1 μm and equal to or less than 20 μm.

A method for measuring the average plating depth and the average pore pitch of the plurality of pores 14 will be described. In the cross section of the porous body 12, a cross-section curve (primary profile) is obtained by applying a low-pass filter with a predetermined cutoff value λs to a measurement cross-section curve based on JIS B 0601:2013 (ISO 4287:1997). Subsequently, a contour curve is obtained by blocking a long-wavelength component from the cross-section curve by a high-pass filter with a cutoff value λc. This contour curve is referred to as a roughness curve (roughness profile). A standard relationship between λs and λc is, for example, based on JIS B 0651.

A reference surface (a bottom surface of the roughness curve) is decided. When the source connector 10 is made of Cu and the porous body 12 is made of Ni, the reference surface is, for example, an interface between Cu and Ni.

The average plating depth is obtained by measuring a total of 20 distances between portions of vertexes (maximum heights) and the reference surface in the roughness curve and averaging the measured distances. The plating depth corresponds to Zt (maximum cross section height or contour curve element height (profile element height)) of JIS B 0601:2013 (ISO 4287:1997).

The average pore pitch is obtained by measuring a total of 20 distances between adjacent vertexes in a plane parallel to the reference plane in the roughness curve and averaging the measured distances.

Regarding the surface roughness of the porous body 12, a line roughness (maximum height roughness in JIS B 0601) Rz is preferably equal to or more than 3 μm and equal to or less than 20 μm. A surface roughness Sz (ISO 25178) is preferably equal to or more than 5 μm and equal to or less than 30 μm. The line roughness Rz and the surface roughness Sz are measured by using a commercially available roughness measuring instrument.

The wettability of the surface of the porous body 12 is preferably equal to or more than 38 dyne/cm.

The shear strength between the porous body 12 and the molded resin 30 is preferably high. The shear strength can be measured by using, for example, a commercially available bond tester.

Next, a method for manufacturing the semiconductor device 100 according to the embodiment will be described.

A method for manufacturing the porous body 12 will be described. For example, first, fine hydrogen ($H_2$) bubbles are generated on a surface of the source connector 10 in an electrolytic plating process. Subsequently, a plating layer is grown so as to take in the hydrogen bubbles. Accordingly, the plating layer used as the porous body 12 can be formed. Here, the porous body 12 can be formed on all the surfaces of the source connector 10. The porous body 12 cannot be formed on a specific surface by covering the specific surface. The method for producing the porous body 12 according to the embodiment is not limited thereto.

The semiconductor device 100 using the source connector 10 in which the porous body 12 is formed can be preferably manufactured by a known method.

Next, actions and effects of the semiconductor device according to the embodiment will be described.

The semiconductor element 6 is sealed with the molded resin 30 for protection from light, heat, humidity, external impurities, and the like. Here, a method for electrically connecting the semiconductor element 6 sealed in this manner and the external electric circuit becomes a problem.

First, a signal for controlling the semiconductor element 6 is input to the gate electrode of the semiconductor element 6. A current and a voltage of such a control signal are generally not large. Thus, the electrical connection between the gate electrode of the semiconductor element 6 and the external electric circuit may be performed by, for example, two connectors of the gate connector 20 and the connector 22a, and the entire gate connector 20 is covered by the molded resin 30, as in the semiconductor device 100, although such electrical connection results in large wiring resistance. This is because external impurities are less likely to enter the semiconductor element 6 from the outside of the molded resin 30 when the connection is performed via two connectors as compared with a case where the connection with the external electric circuit is performed by using one connector.

However, in order to reduce an ohmic loss of a wiring, the electrical connection between the source electrode and the external electric circuit is performed by exposing the upper surface of the source connector 10 from the molded resin 30 without using a plurality of connectors as in the case of the gate electrode. In this case, the molded resin 30 is likely to be delimited at an interface between the source connector 10, particularly the side surface 10b and the side surface 10d, and the molded resin 30 due to thermal stress at the time of mounting or heating and cooling cycles at the time of driving the semiconductor element 6. Accordingly, there is a problem that the external impurities or the like enter the surface of the semiconductor element 6 from portions at which the molded resin 30 is delimited, corrode the electrode of the semiconductor element 6, and a conduction failure is caused. This problem is serious because a path through which the external impurities or the like enter is shorter in a portion having a shorter distance such as the side surface 10b than in a portion having a longer distance such as the side surface 10d, the surface 10e, and the side surface 10f. Also, there is a similar problem which happens on an interface between the molded resin 30 and base frame 2.

In order to suppress the delimitation the molded resin 30, it is considered that adhesion between the molded resin 30 and the surface of the source connector 10 or the surface of the base frame 2 is improved by performing etching processing on the surface of the source connector 10 and the surface of the base frame 2 (anchor effect). However, Cu which is preferably used for the source connector 10 and the base frame 2 is likely to be oxidized. The corrosion resistance of Cu is not high. Thus, the problem of the delimitation of the molded resin 30 cannot be sufficiently solved by the etching processing.

In order to improve corrosion resistance, a method for protecting the surface of the source connector 10 and the surface of the base frame 2 with plating of Ni or the like is considered. However, the adhesion between the surface of the source connector 10 or the surface of the base frame 2 protected by the plating of Ni or the like and the molded resin 30 is not good. Thus, the problem of the delimitation of the molded resin 30 cannot be solved.

The semiconductor device 100 according to the embodiment includes the base frame 2, the semiconductor element 6 provided on the base frame 2, the source connector 10 provided on the semiconductor element 6, the connector having the upper surface 10c, the side surface 10b, and the porous body 12 having the plurality of pores 14 provided on at least the side surface 10b, and the molded resin provided in the periphery of the semiconductor element 6 and at least the side surface 10b of the source connector. The upper surface 10c of the source connector is exposed.

The porous body 12 is provided on the side surface 10b of the source connector 10, and thus, the molded resin 30 enters the pores 14 of the porous body 12. Accordingly, the adhesion is improved, and the delimitation hardly occurs. The porous body 12 is provided, and thus, the corrosion resistance of the source connector 10 is improved. Thus, a highly reliable semiconductor device can be provided.

In order to improve the adhesion between the porous body 12 and the molded resin 30, the average plating depth of the plurality of pores 14 is preferably equal to or more than 3 μm and equal to or less than 20 μm. When the average plating depth is smaller than 3 μm, sufficient adhesion cannot be obtained. On the other hand, when the average plating depth is larger than 20 μm, a large amount of plating waste is generated at the time of manufacturing, and the porous body 12 cannot be formed well.

The average pore pitch of the plurality of pores is preferably equal to or more than 1 μm and equal to or less than 20 μm. When the average pore pitch is smaller than 1 μm, sufficient adhesion cannot be obtained. On the other hand, when the average pore pitch is larger than 20 μm, a large amount of plating waste is generated at the time of manufacturing, and the porous body 12 cannot be formed well.

The line roughness Rz of the porous body is preferably equal to or more than 3 μm and equal to or less than 20 μm. When the average plating depth is smaller than 3 μm, sufficient adhesion cannot be obtained. On the other hand, when the linear roughness is larger than 20 μm, a large amount of plating waste is generated at the time of manufacturing, and the porous body 12 cannot be formed well.

The porous body 12 preferably contains Ni, because the porous body 12 with Ni can be easily formed and fits the requirement of previous characteristics.

The porous body 12 may be further provided on the upper surface 10c of the source connector. This is because a plating layer containing, for example, tin (Sn) used for mounting the semiconductor device 100 is favorably formed by providing the porous body 12.

Hereinafter, Example 1 and Example 2 will be described in comparison with Comparative Example 1 and Comparative Example 2.

Example 1

Fine hydrogen ($H_2$) bubbles were generated on the surface of the source connector 10 by using an electrolytic plating process. Subsequently, the source connector 10 in which the porous body 12 was formed on all the surfaces at a film thickness of 10 μm by growing a Ni plating layer so as to take in the hydrogen bubbles and was manufactured. The semiconductor device was manufactured by using the source connector.

Example 2

A semiconductor device was manufactured by a method similar to Example 1. However, in the manufacturing of the semiconductor device, the source connector 10 in which the porous body 12 was formed on all the surfaces at a film thickness of 20 μm was used.

Comparative Example 1

A semiconductor device was manufactured by using the source connector 10 without the porous body 12.

Comparative Example 2

A semiconductor device was manufactured by a method similar to Example 1. However, in the manufacturing of the semiconductor device, the source connector 10 in which the porous body was formed on all the surfaces at a film thickness of 3 μm was used.

Subsequently, for Example 1, Example 2, Comparative Example 1, and Comparative Example 2, the average plating depth, the average pore pitch, the line roughness Rz, the surface roughness Sz, surface tension wetting determination, and a shear strength ratio were evaluated by the following methods.

The average plating depth was evaluated based on cross-sectional SEM observation of the porous body 12.

The average pore pitch was evaluated based on cross-sectional SEM observation of the porous body 12.

The line roughness Rz and the surface roughness Sz were measured by measuring the surface of the porous body 12 by using a laser microscope (OLS 4100 manufactured by Olympus Corporation).

The wetting of surface was determined by drawing a straight line on the surface of the porous body 12 by using a test pen with different surface tension manufactured by Arcotest GmbH. Here, when a straight line state does not change after the straight line is drawn, it is determined that the surface is wet. For example, when the state of the straight line drawn on the surface of the porous body 12 by using a test pen of 30 dyne/cm does not change, it is determined that the wettability of the surface of the porous body 12 is equal to or more than at least 30 dyne/cm. In this case, "○" is described in Table 1 to be described later. On the other hand, when the straight line is drawn by using the test pen of 30 dyne/cm and then becomes a water droplet within 5 minutes, the wettability is described as "Δ" for 30 dyne/cm. When the straight line is drawn by using the test pen of 30 dyne/cm and then becomes a water droplet within 5 seconds, the wettability is described as "x" for 30 dyne/cm. It was determined that the porous body with higher wettability had high wettability of the molded resin 30 with respect to the porous body 12, the adhesion between the porous body 12 and the molded resin 30 was improved.

The shear strength ratio was measured by using a bond tester (Dage-4000 manufactured by Nordoson Dage). Here, the shear strength ratio was measured for a semiconductor device manufactured by using two types of resins (resin 1 and resin 2). The resin 1 has a linear expansion coefficient $\alpha_1=14$ (ppm/° C.) and a glass transition temperature $T_g=135°$ C. The resin 2 has a linear expansion coefficient $\alpha_1=21$ (ppm/° C.) and a glass transition temperature $T_g=165°$ C. Here, the shear strength ratio is a ratio of the strength of the semiconductor device to the strength of the semiconductor device of Comparative Example surface roughness Sz do not fall within the preferred ranges. Since the result of the surface tension wetting determination (38 dyne/cm) was "Δ" and the results of the surface tension wetting determination (40 dyne/cm) and the surface tension wetting determination (44 dyne/cm) were "x", it was determined that the adhesion between the molded resin 30 and the porous body 12 was low.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

TABLE 1

| | Average plating depth | Average pore pitch | Line roughness Rz | Surface roughness Sz | Surface tension wetting determination (30 dyne/cm) | Surface tension wetting determination (34 dyne/cm) |
|---|---|---|---|---|---|---|
| Example 1 | 6 μm or more and 10 μm or less | 7 μm or more and 15 μm or less | 10.15 μm | 17.98 μm | ○ | ○ |
| Example 2 | 12 μm or more and 17 μm or less | 5 μm or more and 10 μm or less | 14.399 μm | 23.736 μm | ○ | ○ |
| Comparative Example 1 | None | None | None | None | ○ | ○ |
| Comparative Example 2 | 1 μm or more and 2 μm or less | 4 μm or more and 12 μm or less | 2.43 μm | 3.841 μm | ○ | ○ |

| | Surface tension wetting determination (38 dyne/cm) | Surface tension wetting determination (40 dyne/cm) | Surface tension wetting determination (44 dyne/cm) | Shear strength ratio (resin 1) | Shear strength ratio (resin 2) |
|---|---|---|---|---|---|
| Example 1 | ○ | ○ | ○ | 1.43 | 3.14 |
| Example 2 | ○ | ○ | ○ | 1.33 | 3.89 |
| Comparative Example 1 | ○ | Δ | Δ | — | — |
| Comparative Example 2 | Δ | x | x | — | — |

As is clear from Table 1, in Examples 1 and 2, although there is a difference depending on a portion to be measured, the average plating depth is in the range of 3 μm or more and 20 μm or less, the average pore pitch is in the range of 1 μm or more and 20 μm or less, the line roughness Rz is in the range of 3 μm or more and 20 μm or less, and the surface roughness Sz is in the range of 5 μm or more and 30 μm or less. In the surface tension wetting determination, determination at 44 dyne/cm was also "○", and indicated high wettability as compared with Comparative Example 1. Since the shear strength ratio was also high in both the cases of the resin 1 and the resin 2, it was determined that the adhesion between the molded resin 30 and the porous body 12 was high.

In Comparative Example 1, the results of the surface tension wetting determination (40 dyne/cm) and the surface tension wetting determination (44 dyne/cm) were "Δ".

In Comparative Example 2, all the average plating depth, the average pore pitch, the line roughness Rz, and the

What is claimed is:

1. A semiconductor device comprising:
   a base frame;
   a semiconductor element provided on the base frame;
   a connector provided on the semiconductor element, the connector having an upper surface, a side surface, and a porous body having a plurality of pores provided on at least the side surface; and
   a molded resin provided in a periphery of the semiconductor element and at least the side surface of the connector,
   wherein the upper surface of the connector is exposed.

2. The semiconductor device according to claim 1, wherein an average depth of the pores is 3 μm or more and 20 μm or less.

3. The semiconductor device according to claim 1, wherein an average pore pitch of the pores is equal to or more than 1 μm and equal to or less than 20 μm.

4. The semiconductor device according to claim 1, wherein a line roughness Rz of the porous body is equal to or more than 3 μm and equal to or less than 20 μm.

5. The semiconductor device according to claim 1, wherein a surface roughness Sz of the porous body is equal to or more than 5 μm and equal to or less than 30 μm.

6. The semiconductor device according to claim 1, wherein wettability of a surface of the porous body is equal to or more than 38 dyne/cm.

7. The semiconductor device according to claim 1, wherein the porous body contains nickel (Ni).

8. The semiconductor device according to claim 1, wherein the porous body is further provided on the upper surface, and the porous body provided on the upper surface is exposed.

9. The semiconductor device according to claim 1, further comprising: a first bonding material provided between the base frame and the semiconductor element.

10. The semiconductor device according to claim 1, further comprising: a second bonding material provided between the semiconductor element and the connector.

* * * * *